(12) United States Patent
Hofsäss et al.

(10) Patent No.: US 11,031,205 B1
(45) Date of Patent: Jun. 8, 2021

(54) DEVICE FOR GENERATING NEGATIVE IONS BY IMPINGING POSITIVE IONS ON A TARGET

(71) Applicant: GEORG-AUGUST-UNIVERSITÄT GÖTTINGEN STIFTUNG ÖFFENTLICHEN RECHTS, UNIVERSITÄTSMEDIZIN, Göttingen (DE)

(72) Inventors: Hans Hofsäss, Göttingen (DE); Felipe Lipp Bregolin, Dresden (DE); Dimitar Yordanov, Göttingen (DE)

(73) Assignee: GEORG-AUGUST-UNIVERSITÄT GÖTTINGEN STIFTUNG ÖFFENTLICHEN RECHTS, UNIVERSITÄTSMEDIZIN, Göttingen (DE)

(*) Notice: Subject to any disclaimer, the term of this patent is extended or adjusted under 35 U.S.C. 154(b) by 0 days.

(21) Appl. No.: 16/781,569

(22) Filed: Feb. 4, 2020

(51) Int. Cl.
*H01J 37/08* (2006.01)
*H01J 27/26* (2006.01)

(52) U.S. Cl.
CPC .............. *H01J 27/26* (2013.01); *H01J 37/08* (2013.01); *H01J 2237/0815* (2013.01)

(58) Field of Classification Search
None
See application file for complete search history.

(56) References Cited

U.S. PATENT DOCUMENTS

| | | | |
|---|---|---|---|
| 3,573,454 A | 4/1971 | Andersen et al. | |
| 3,631,283 A | 12/1971 | Gautherin et al. | |
| 3,967,115 A | 6/1976 | Kern | |
| 4,423,324 A * | 12/1983 | Stafford | G01T 1/28 250/281 |

(Continued)

FOREIGN PATENT DOCUMENTS

| | | | |
|---|---|---|---|
| CA | 2131942 A1 * | 3/1996 | ............. H01J 49/28 |
| DE | 1917843 A1 | 10/1969 | |

(Continued)

OTHER PUBLICATIONS

Alton et al., "Design Features of High-Intensity, Cesium-Sputter/Plasma-Sputter Negative Ion Source," Rev. Sci. Instrum., vol. 65, No. 6, Jun. 1994, pp. 2006-2011 (Total 7 pages).

(Continued)

*Primary Examiner* — James Choi
(74) *Attorney, Agent, or Firm* — Birch, Stewart, Kolasch & Birch, LLP

(57) ABSTRACT

A device for generating negative ions comprises:
  a) an ionizer (14) including a heatable ionizer surface;
  b) a heater (60) for heating said ionizer whereby positive ions (30) are generated at said ionizer surface (14*e*);
  c) a target (34) including a material for generating negative ions when said positive ions impigne on said material;
wherein
  d) said ionizer is arranged opposite the target;
  e) said target is electrically negatively biased in respect to said ionizer;

(Continued)

f) said ionizer comprises an aperture (22) through which said generated negative ions are extracted from said target to generate a beam (50) of negative ions; and
wherein
g) said ionizer surface (14*e*) is planar.

9 Claims, 4 Drawing Sheets

(56) References Cited

U.S. PATENT DOCUMENTS

| | | | |
|---|---|---|---|
| 4,471,224 A * | 9/1984 | Cuomo | H01J 27/20 250/423 R |
| 4,801,849 A | 1/1989 | Slodzian et al. | |
| 4,835,383 A * | 5/1989 | Mahoney | B01D 59/44 250/281 |
| 6,590,206 B1 | 7/2003 | Evrard | |
| 2013/0087716 A1 | 4/2013 | Buhler et al. | |

FOREIGN PATENT DOCUMENTS

| | | |
|---|---|---|
| DE | 1920183 A1 | 8/1970 |
| DE | 2545166 A1 | 8/1976 |
| EP | 0060075 A | 9/1982 |
| EP | 0165140 B1 | 5/1988 |
| JP | 11-185648 A | 7/1999 |
| WO | WO 2004/108257 A2 | 12/2004 |

OTHER PUBLICATIONS

Alton et al., "Negative Ion Sources Equipped with Continuous Annular and Spherical Geometry Surface Ionizers," IEEE Trans. Nucl. Sci., vol. NS-32, No. 5, Oct. 1985, pp. 1822-1825.
Alton et al., "Recent Advancements in Sputter-Type Heavy Negative Ion Sources," Proc. of the 1989 IEEE Particle Accelerator Conference, 1989, pp. 1112-1116.
Caskey et al., "A Simple Negative-Ion Sputter Source," Nucl. Instr. Meth., vol. 157, 1978, pp. 1-7.
Chapman, "Development of the Inverted Sputter Source," IEEE Trans. Nucl. Sci., vol. NS-23, No. 2, Apr. 1976, pp. 1109-1112.
Halas et al., "Use of Negative Ion Mass Spectrometry for Simultaneous Determination of Sulfur Isotope Ratios $\Delta^{33}S$ and $\Delta^{34}S$," Annales Universitatis Mariae Curie-Sklodowska, vol. LXX, Sectio AAA, 2015, pp. 77-82.
Hellborg, "Electrostatic Accelerators Fundamentals and Applications," Springer-Verlag Berlin Heidelberg, The Netherlands, 2005, pp. 1-620 (Total 629 pages).
Middleton, "A Survey of Negative Ion Sources for Tandem Accelerators," Nucl. Instr. and Meth., vol. 122, 1974, pp. 35-43.
Middleton, "A Versatile High Intensity Negative Ion Source," Nucl. Instr. Meth., vol. 214, 1983, pp. 139-150.

* cited by examiner

DEVICE FOR GENERATING NEGATIVE IONS BY IMPINGING POSITIVE IONS ON A TARGET

The invention is concerned with a device for generating negative ions.

Negative ions can be formed by several methods, e.g. by electron impact, charge exchange in metal vapors and on surfaces.

Negative ion beams are widely used. Some examples for the application of beams of negative ions are ion implantation, plasma etching, plasma thrusters, mass spectrometry, particle accelerators, additional heating in nuclear fusion, etc.

In connection with the present invention the well-known method of alkali metal sputtering is utilized. Accordingly, negative ions are generated by using a beam of positively charged alkali metal ions to sputter a target (R. Middleton and C. T. Adams, *Nucl. Instr. and Meth.* 118 (1974) 329). The beam of positively charged alkali metal ions, typically Cs, is produced by diffusing alkali metal vapour through a porous tungsten ionizer. The positive beam is accelerated by an electric field in the kV range and impignes on a surface of a target. The target according to the prior art is typically conically shaped and comprises a material of interest. The alkali metal ion beam sputters the material of interest and lowers the work function of the target surface. By sputter erosion negative ions are generated. In the ion source of Middleton and Adams the negative ions are extracted at 20 keV through a 3 mm diameter aperture. Due to the electrode configuration, the method of extraction and the high energy distributions of the sputter process the beam of negative ions has a high aberration and, consequently, a relatively high emittance. Because of the simplicity, reliability, versatility and long lifetime of this type of source, it was quickly adapted for use in many tandem accelerator laboratories.

Subsequently such ceasium-sputter negative ion sources have been further developed. Typically, the target (also called sample) has a conical shape for negative ion generation. The beam of positively charged alkali metal ions is generated by diffusion through a ring-shaped ionizer comprising a porous tungsten surface surrounding a sample hole, through which sputter-generated negative ions are extracted (see e.g. K. R. Chapman, *IEEE Trans. Nucl. Sci. NS*-23 (1976) 1109).

Several sources of negative ion beams have been developed since. They are equipped with an external oven for feeding alkali metal vapor into the device, different types of surface ionizers and sputter sample cathodes. With regard to the ionizer, producing positive alkali ions, cylindrical (e.g. G. D. Alton, G. D. Mills, *IEEE Trans. Nucl. Sci. NS*-32 (1985) 1822), spherical (G. D. Alton, "Proc. of the 1989 IEEE Particle Accelerator Conference" 89CH2669-0, 2 (1989) 1112), ellipsoidal (G. D. Alton, "Proc. 11th Symposium on Ion Sources and Ion-Assisted Technology, Tokyo" (1987) 157), and conical (G. D. Alton, *Rev. Sci. Instrum.* 65 (1994) 1141) geometries have been proposed.

In the prior art also cylindrical ionizers are known, wherein the axis of the cylinder is also the central axis of the ion source, e.g. G. T. Caskey, R. A. Douglas, H. T. Richards, H. V. Smithe Jr., *Nucl. Instr. Meth.* 157 (1978) 1; and R. Hellborg (Ed.) "Electrostatic Accelerators Fundamentals and Applications" (Springer-Verlag Berlin Heidelberg, 2005).

Middleton also describes an ion source equipped with an annular ionizer. The ionizer is located behind the sputter plane (viewed in the direction opposed to the direction of the beam of negative ions). The ionizer surface is planar, however, the surface is not arranged opposite the target and the generated negative ions are not extracted by and through the ionizer (R. Middleton, *Nucl. Instr. Meth.* 214 (1983) 139).

The present invention is based on the above cited prior art and aims at improving it with regard to, in particular, to the following objectives:

The cathode voltage shall be increased, i.e. the voltage between the target and the ionizer, resulting in more energetic alkali metal ions heating the sputter surface at the target and causing higher sputter rates and larger extracted beams of negative ions. However, such higher cathode voltages shall be reached without arc discharges.

The versatility (flexibility) of the device for generating negative ions (in short: ion source) shall be improved. This means that the adjustability of the ion source in connection with different applications shall be improved by allowing an easy change of the relative positions of the components.

The structure of the ion source shall be stable during its operation, i.e. tilting and bending of components due to thermal effects shall be inhibited.

When assembling the ion source, the ionizer surface shall be adjusted automatically such that its normal is parallel to the axis of the ion source and this parallel arrangement shall be stable even when the ion source temperature increases.

Simple and cheap fabrication of the ion source.

Easy replacement and cleaning of components, in particular the ionizer surface.

According to the present invention, the above objectives, at least partially, are achieved by a device generating negative ions comprising:

a) an ionizer including a heatable ionizer surface;

b) a heater for heating said ionizer whereby positive ions are generated at said ionizer surface;

c) a target including a material for generating negative ions when said positive ions impigne on said material; wherein d) said ionizer is arranged opposite the target;

e) said target is electrically negatively biased in respect to said ionizer;

f) said ionizer comprises an aperture through which said generated negative ions are extracted from said target to generate a beam of negative ions; and wherein g) said ionizer surface is planar.

According to the present invention, the ionizer surface is planar and arranged such that the normal of the planar ionizer surface coincides with the central axis of the system. The system as a whole is essentially rotationally symmetrical and, therefore, comprises a central axis. The planar ionizer surface is arranged perpendicular with regard to the central axis. The central axis also corresponds to the longitudinal axis of the generated beam of negative ions. The center of the planar ionizer surface is at the central axis. The central axis crosses the ionizer surface.

This design allows relatively high cathode voltages (i.e. the difference in electrical potential between the target and the ionizer) and, therefore, more energetic positive alkali metal ions sputter the surface of the target causing higher sputter rates and extracted negative currents. This can be obtained without arc discharges.

According to an embodiment the device for generating negative ions includes an ionizer comprising two plates arranged in parallel to each other and both plates being arranged perpendicular to said central axis which coincides with the longitudinal axis of the beam of negative ions. The two plates are arranged at a distance along said axis. This design allows for a versatile arrangement of ionizer and cathode (target) and this versatility, in turn, allows for an optimum focusing of the positive alkali ions on the cathode (target). The ionizer according to this design is modular, consisting of two planar ionizer plates and spacer rings, which provide flexibility regarding the relative positions of the components.

According to an embodiment, the ionizer is fixed at a cylindrical housing of the ion source. The housing of the ion source is, typically, cylindrical and the circumference of the ionizer is also cylindrical. The outer diameter of the cylindrical ionizer corresponds to the inner diameter of the cylindrical housing such that, when assembling the ion source, the ionizer is automatically adjusted centrally with regard to the other components mounted in the housing. In particular, the ionizer surface is always parallel to the cathode (target). The surface of the target including the material for generating negative ions by sputtering is also defining a plane perpendicular to the central axis.

The device for generating negative ions according to the invention also allows for a simple and cheap fabrication of, in particular, the ionizer surfaces which can be manufactured from thin metal plates. The only condition regarding the material to be used for the plates including the ionizer surface is the use of a metal with a high melting point, most common material is tungsten.

Furthermore, the device for generating negative ions according to the invention allows for a convenient replacement and cleaning of the ionizer surface. The design according to claim 1 facilitates a modular configuration. In particular, the heater for heating the ionizer can be arranged such that an easy access to a heater filament is possible for a replacement of a heating filament. The heating filament can be arranged in between the plates of the ionizer.

In the following embodiments of the present invention are described in detail with reference to the figures.

FIG. 1 shows a cross section through a device for generating negative ions, the device being composed of a head 10 and a back 12. The device is essentially rotationally symmetrical about a central axis A.

In the head 10 an ionizer 14 is positioned. The ionizer 14 generates positive alkali ions, typically Cs ions. The ionizer 14 is described in more detail below in connection with FIGS. 2, 4 and 5.

A housing 16 of the head 10 is a cylindrical stainless steel body. The ionizer is precisely positioned within the housing 16.

Figure 1:
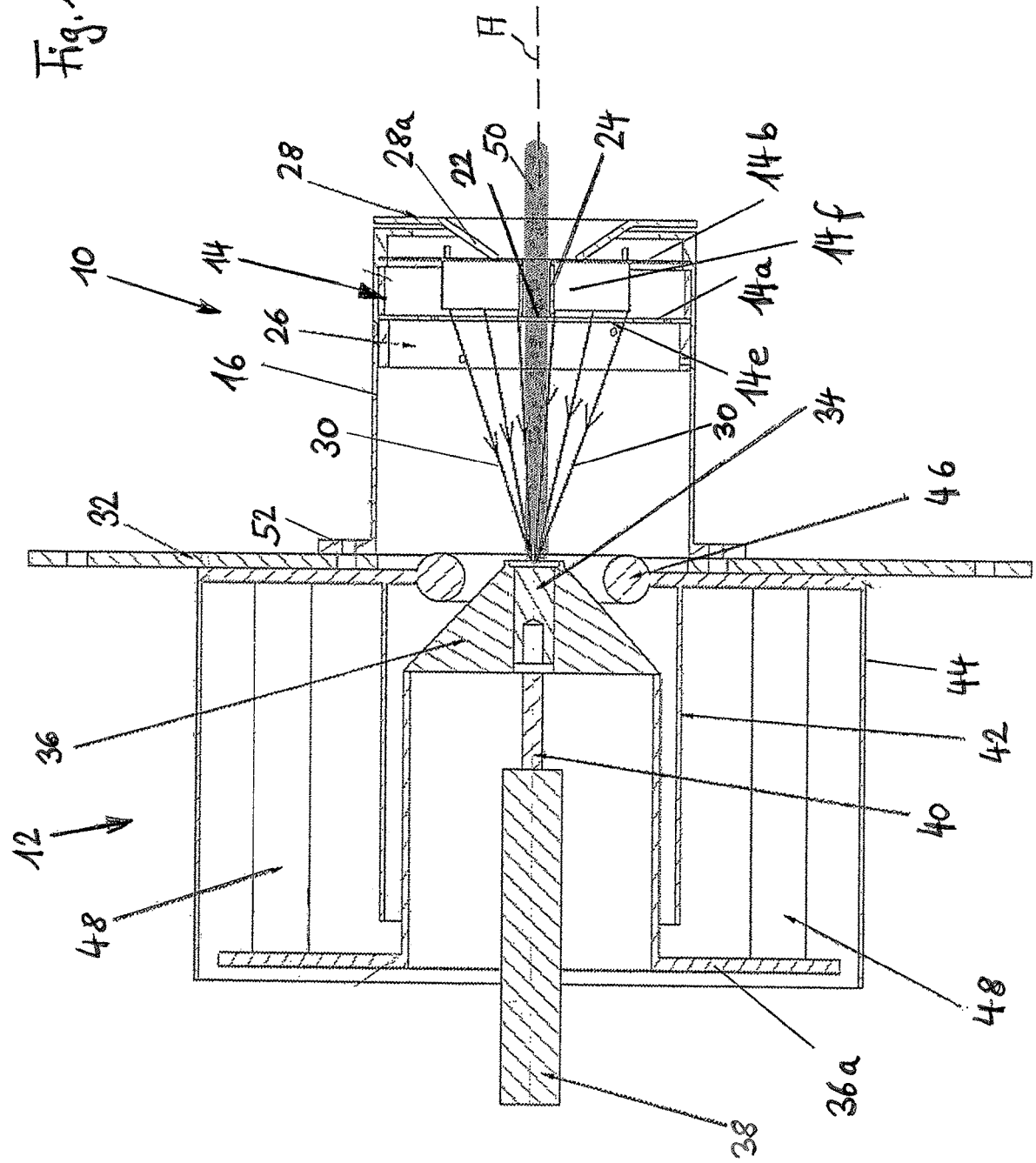
FIG. 1 shows a cross section of a device for generating negative ions.
Figure 2:
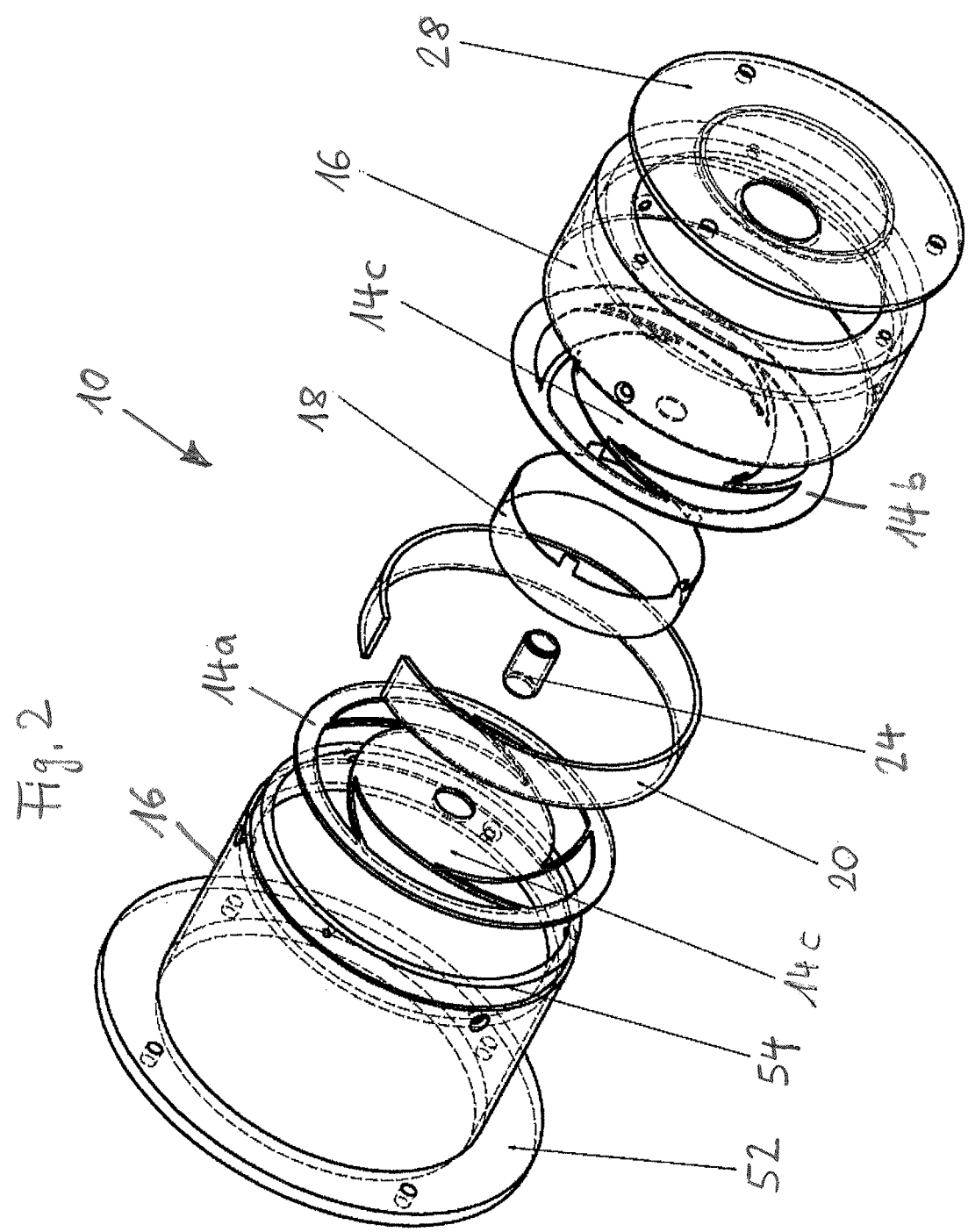
FIG. 2 shows an exploded view of the head of the device for generating negative ions.
Figure 4:
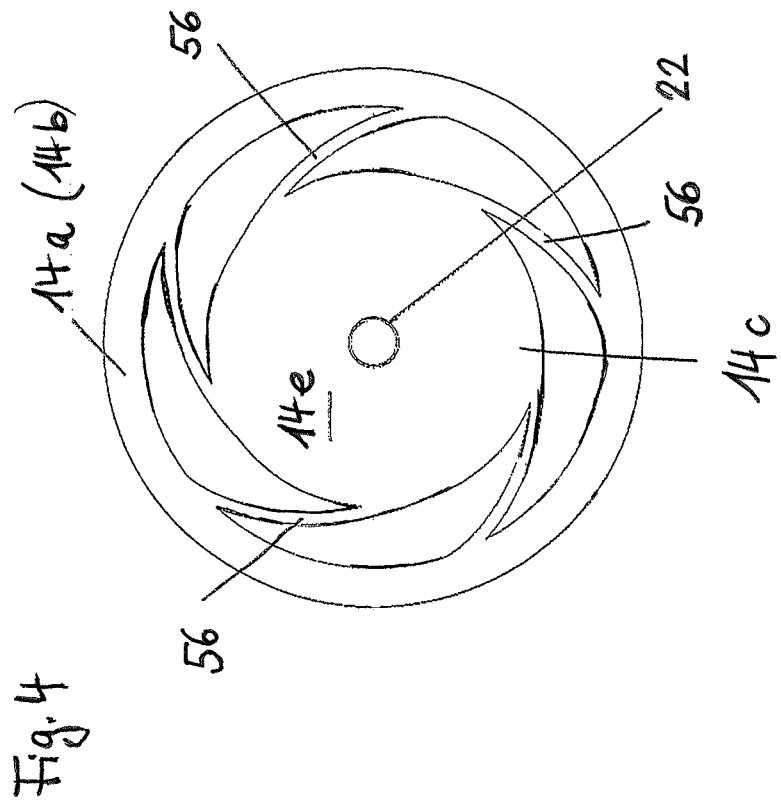
FIG. 4 shows an example of one of the two plates forming the ionizer in the device for generating negative ions.
Figure 5:
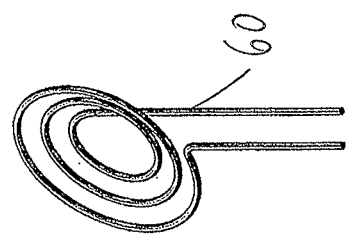
FIG. 5 shows a heating filament.

As shown in FIG. 2, the ionizer 14 is composed of two plates, each plate comprising an outer ring 14a, 14b. Within the outer ring each plate comprises an inner disc 14c as is shown in FIG. 4. According to FIG. 1, the two plates of the ionizer 14 are arranged in parallel, i.e. the outer rings 14a and 14b of the plates are arranged in parallel and such that the central axes of the rings coincide with the central axis A of the device for generating negative ions.

Each ring 14a, 14b encircles an inner disc 14c, wherein the inner disc 14c is connected to the outer ring 14a, 14b by struts 56. The struts 56 (FIG. 4) connect the inner disc 14c radially with the outer ring 14a and 14b, respectively. As is shown in FIG. 4, the struts are connected to the inner disc 14c approximately tangentially.

The struts 56, as is shown in FIG. 4, to not extend exactly radially but form an angle with the radii in a range from 30° to 85°, in particular in a range between 45° and 80°. This angled arrangement ensures positional stability of the inner-disc 14c when heating it.

The inner disc 14c comprises the ionizing surface 14e.

The outer ring 14a, the struts 56 and the inner disc 14c are made e.g. of porous tungsten. As is well known in the art, when alkali vapor passes through hot porous tungsten, positive alkali ions are generated, e.g. Cs ions. Therefore, at the surface 14e (see FIG. 1), facing in FIG. 1 to the left, positive alkali ions are generated.

Two spacer rings are provided for precise positioning of the ionizer plates. A first spacer ring 18 has a smaller diameter as compared to a second spacer ring 20. The two spacer rings have the same lengths in axial direction. Steps or the like are provided in the housing 16 such that the spacer rings and the plates are precisely positioned by abutting against the steps. The housing 16 can also be composed of two parts (see FIG. 2) and when, during assembly of the head 10, the two parts of the housing are connected to each other by screws of the like, the components inside the housing, i.e. in particular the described components of the ionizer, are precisely positioned.

In the center of each inner disc 14c an aperture 22 is provided, see FIGS. 1 and 4. A hollow cylinder 24 is arranged to connect the two inner discs 14c of the ionizer 14 forming a channel for the beam of negative ions described further below.

A ring 26 also serves for positioning the ionizer 14.

The above described design of the plates of the ionizer, each plate being composed of an outer ring 14a (14b), struts 56 and an inner disc 14c secures a stable position of the ionizer surface 14e under high temperature conditions. Thermal expansions have practically no influence on the geometrical position of the ionizer surface 14e.

A cover 28 closes the front side of the head 10. The cover 28 comprises a conical protrusion 28a for pushing the components inside the housing 16 of the head 10 in position and a central hole through which the beam 50 of negative ions passes.

In a free space 14f inbetween the two plates composing the ionizer 14 (see FIG. 1), a heating filament 60 (see FIG. 5) is arranged to heat the porous tungsten material of the ionizer. The electrical lines connecting the heating filament 60 to a power source are not shown in FIG. 1.

Alkali metal vapor from an oven (not shown) outside the device is introduced into the device and the ionizer through lines (not shown) and the ionizer and surrounding components are kept at a temperature to avoid condensation of the alkali vapor. As is stated above, positive alkali ions are generated in the porous tungsten and the such generated positive alkali ions are accelerated onto a target 34. The target 34 is at high electrical negative potential relative to the ionizer 14 such that the positive alkali ions 30 according to the arrows in FIG. 1 are accelerated and impigne onto the target 34. The ionizer surface 14e is planar (the term "planar" in this patent includes also "essentially planar"), in contrast to the prior art, where the ionizer surface is typically non-planar, e.g. spherical or ellipsoidal or the like. This geometry of the ionizer surface 14e and the target 14 as shown in FIG. 1 allows for an optimal distance between said components to reach high voltages between the target and the ionizer without arc discharges.

Figure 3:
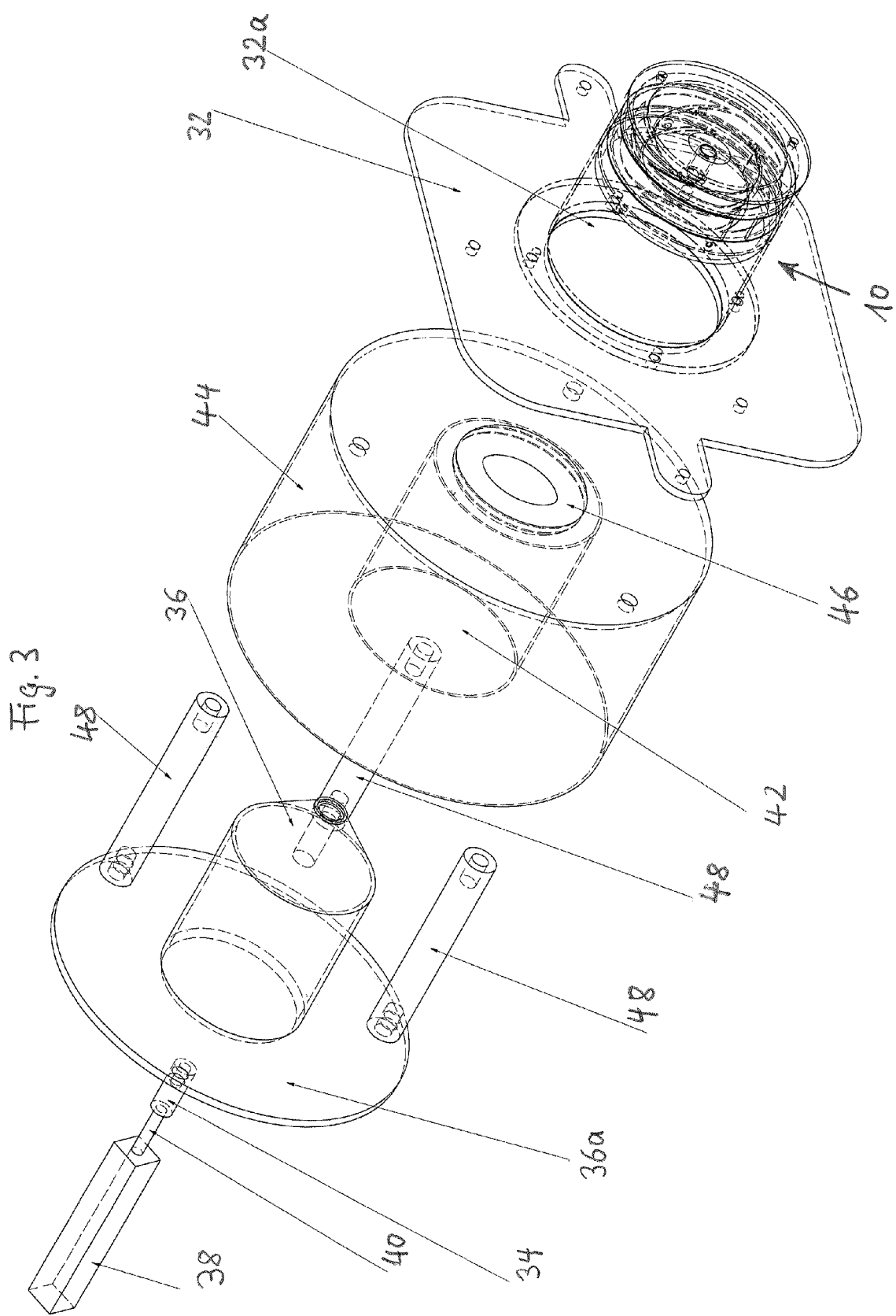
FIG. 3 shows an exploded view of the back of the device for generating ions.

The back 12 of the device for generating negative ions is shown in FIGS. 1 and 3. A carrier plate 32 serves to connect the head 10 and the back 12 of the device. A mounting plate 52 (FIG. 1) connects the head 10 to the carrier plate 32.

A cylinder 44 (FIG. 1) is connected to the carrier plate 32 and houses the target 34 and other components. The target 34 serves as a cathode in the device for generating negative ions, i.e. the target 34 is at high negative electrical potential to attract the positive alkali ions 30. The positive alkali ions impigning onto the target produce negative ions by sputter erosion of the target material. This technology as such is well known in the art (see above Middleton et al.). Sputter erosion at the target means that alkali atoms are implanted into the cathode material up to a certain saturation concentration. Through charge exchange between alkali atoms in the cathode and sputtered target atoms, negatively charged ions are created and extracted through a centered aperture 22 in the ionizer surface 14e (FIG. 4). This way the beam 50 of negative ions is generated.

The target 34 is arranged such that the planar surface of the target material used for sputter erosion is arranged parallel to the ionizer surface 14e, i.e. perpendicular to the central axis A of the device.

The target 34 is supported by a target carrier 36 and the target carrier 36 is supported by a cylinder 36a (FIG. 1). As is stated above, the target 34 and the target carrier are at high negative electrical potential. The other components of the device, in particular the ionizer 14, are at ground potential. An isolating rod 38 and a threaded bolt 40 (see FIGS. 1 and 3) are used to position the target in place. Shielding cylinders 42 and 44 protect isolators 48 supporting the target carrier 36 (via the supporting cylinder 36a). To avoid sharp edges near the cathode, the edge of the shielding cylinder 42 is formed as a rounded ring 46 (FIG. 1). The cylinders 42 and 44 serve to avoid that alkali atoms condense at the isolating rods 48 (as is shown in FIG. 3, three isolating rods 48 are provided).

The beam 50 of negative ions produced by sputter erosion passes through the aperture 22 in the ionizer 14.

The above design of the device with a planar ionizer surface 14e facing a planar target with both planes in parallel allows the application of very high negative voltages (e.g. −20 kV) to the target (cathode) without arc discharges. This allows for very energetic alkali metal ions heating the target surface in a well-centered and narrow spot, causing high sputter rates and a strong high quality beam of negative ions.

The planar design of the ionizer surface facing the target provides auto-compensation of thermal expansion effects. The design shown in FIG. 4 results only in an in-plane rotation of the ionizer surface and not in an unwanted out-off-plane tilting or bending.

LIST OF REFERENCE NUMERALS 10 head
12 back
A axis
14 ionizer
14a outer ring (of 14)
14b outer ring (of 14)
14c inner disc (of 14)
14d radial/tangential struts
14e ionizer surface
14f space for heater
16 housing (of 10)
18 spacer ring (small)
20 spacer ring (large)
22 aperture (in 14c)
24 hollow cylinder (forming extraction aperture)
26 ring (for positioning 14)
28 cover
28a protrusion (of 28)
30 positive alkali ions
32 carrier plate
32a hole (in 32)
34 target (=cathode)
35 target carrier
36a target support cylinder
38 isolating rod
40 threaded bolt
42 shielding cylinder
44 shielding cylinder
46 ring
48 isolator
50 beam of negative ions
52 mounting plate (of 10)
54 positioning ring
56 struts
60 heating filament

The invention claimed is:

1. A device for generating negative ions, said device comprising:
   a) an ionizer including a heatable ionizer surface;
   b) a heater for heating said ionizer whereby positive ions are generated at said ionizer surface;
   c) a target including a material for generating negative ions when said positive ions are accelerated from the ionizer to impinge on said material; wherein the ionizer surface is parallel to the target; and wherein
   d) said ionizer is arranged opposite the target;
   e) said target is an electrode electrically negatively biased in respect to said ionizer;
   f) said ionizer surface comprises an aperture through which said generated negative ions are extracted from said target, through said ionizer, to generate a beam of negative ions; and wherein
   g) said ionizer surface is planar.

2. A device according to claim 1, wherein said ionizer and said target comprise a common axis.

3. A device according to claim 1, wherein said ionizer comprises two plates arranged at a distance along said axis.

4. A device according to claim 3, wherein said two plates are separated by one or more spacers.

5. A device according to claim 3, wherein a hollow cylinder is arranged inbetween said two plates, said cylinder forming said aperture through which the negative ions are extracted from said target.

6. A device according to claim 3, wherein said heater is arranged inbetween said plates.

7. A device according to claim 1, wherein said ionizer comprises a plate facing said target and including said heatable ionizer surface, said plate comprising a central inner disc and a peripheral ring, said inner disc being connected to said peripheral ring by struts.

8. A device according to claim 1, wherein said ionizer is fixed to a cylindrical housing of the device.

9. A device according to claim 3, wherein said heater is arranged inbetween said plates.

* * * * *